United States Patent [19]
Brodnax et al.

[11] Patent Number: 5,568,380
[45] Date of Patent: Oct. 22, 1996

[54] SHADOW REGISTER FILE FOR INSTRUCTION ROLLBACK

[75] Inventors: Timothy B. Brodnax, Austin, Tex.; John S. Bialas, Jr., Bealeton; Steven A. King, Herndon, both of Va.; Johnny J. LeBlanc, Austin, Tex.; Dale A. Rickard, Manassas, Va.; Clark J. Spencer, Praha, Czechoslovakia; Daniel L. Stanley, Manassas, Va.

[73] Assignee: International Business Machines Corporation, Armonk, N.Y.

[21] Appl. No.: 114,267

[22] Filed: Aug. 30, 1993

[51] Int. Cl.$^6$ .................................... G05B 9/02
[52] U.S. Cl. .................... 364/184; 395/182.13
[58] Field of Search .................... 364/184–187, 364/265–266.6, 268.9; 395/575, 800, 650; 371/7, 1, 14, 21.1, 37.6, 22.3

[56] References Cited

U.S. PATENT DOCUMENTS

| | | |
|---|---|---|
| 3,736,566 | 5/1973 | Anderson et al. . |
| 4,044,337 | 8/1977 | Hicks et al. . |
| 4,164,017 | 8/1979 | Randell et al. . |
| 4,199,810 | 4/1980 | Gunckel, II et al. . |
| 4,253,183 | 2/1981 | Taylor et al. . |
| 4,413,327 | 11/1983 | Sabo et al. . |
| 4,503,534 | 3/1985 | Budde et al. ............. 371/9 |
| 4,905,196 | 2/1990 | Kirrmann . |
| 4,912,707 | 3/1990 | Kogge et al. . |
| 4,935,929 | 6/1990 | Sidmann et al. . |
| 4,954,988 | 9/1990 | Robb . |
| 4,958,273 | 9/1990 | Anderson et al. . |
| 4,996,687 | 2/1991 | Hess et al. . |
| 5,018,144 | 5/1991 | Corr et al. ............. 371/22.3 |
| 5,155,856 | 10/1992 | Bock et al. ............. 395/800 |
| 5,177,744 | 1/1993 | Cesare et al. ............. 371/10.1 |
| 5,216,672 | 6/1993 | Tatosian et al. ............. 371/21.1 |
| 5,280,616 | 1/1994 | Butler et al. ............. 395/650 |
| 5,323,403 | 6/1994 | Elliott ............. 371/37.6 |
| 5,386,423 | 1/1995 | Koo et al. ............. 371/22.3 |

*Primary Examiner*—James P. Trammell
*Attorney, Agent, or Firm*—Michael A. Davis, Jr.

[57] ABSTRACT

A fault-tolerant computer system having shadow registers for storing the contents of a primary array into a shadow array at the completion of a stored instruction execution. This is accomplished in one clock cycle with all registers being shadowed simultaneously. During rollback of execution steps for a checkpoint retry, the shadow register files provide a signal cycle unload of the shadow array into the primary array. LSSD latches are used in the shadow register file.

7 Claims, 6 Drawing Sheets instruction 1   AR RA, RB
instruction 2   MR RA, RB
instruction 3   ST RA, ADDR (checkpoint)
instruction 4   L RA, ADDR
instruction 5   L RB, ADDR
instruction 6   AR RA, RB
instruction 7   MR RA, RB
instruction 8   ST RA, ADDR (checkpoint)

Traditional Method

Shorter SELECT delay using Shadow Register

SHADOW REGISTER FILE FOR INSTRUCTION ROLLBACK

BACKGROUND OF THE INVENTION

1. Technical Field

The present invention relates to a fault-tolerant computer system and more particularly, to the of use shadow registers for instruction rollback in a fault-tolerant data processing system.

2. Background Art

Data processing systems have historically suffered from both soft errors and hard errors. Soft errors are usually defined as those deviations from the expected output which occur because of electrical noise or other randomly occurring sources which result in nonreproducible fault syndromes. Hard errors are typically associated with electrical components or mechanical component failures producing errors which are reproducible. Many arrangements for fault-tolerant data processing systems have been developed in the prior art. A typical example of a fault-tolerant system is the provision of two or more identical data processing elements to operate on the same instruction stream having their outputs compared with one another. When a difference is detected in the outputs of a pair of data processing elements, it can be inferred that either a soft error or a hard error has occurred. Typically in the prior art, the data processors are then restarted and the instruction stream is then executed in a stepwise manner until the error is detected again. If no error occurs, then the initial error determination is that of a soft error. If the error is repeated when stepping through the instruction stream, then the instruction at which the error occurs can be identified. This prior art approach to the retry of instructions after the detection of a fault is a lengthy one. The prior art has not been found a suitably efficient or fast technique for the retry of instructions after fault detection. An example of a checkpoint retry mechanism is described in U.S. Pat. No. 4,912,707 to Kogge et al., Mar. 27, 1990, commonly assigned to IBM Corporation and whose teaching are incorporated herein by reference.

It is known that to permit circumvention of errors, at least one valid starting point must exist at all times during the normal operation of a data processing system. This valid starting point is a requirement which enables the recovery routine subsequent to a fault to conduct a return to the object program and therefore, maintain the functional integrity of the data processing system.

To accomplish rollback within a central processing unit to its last known good state before an error is detected, the traditional method relies heavily on software. The software task includes storing the processing unit's state in a dedicated memory location periodically throughout the normal instruction processing. This technique is prohibitively time consuming for many applications. One obvious alternative to the software solution, is to store the processing unit's state in dedicated hardware. The drawback to this approach is the large amount of hardware required. What is needed is an improved method and apparatus to provide fault-tolerant checkpoint and retry within a data processing system.

OBJECTS OF THE INVENTION

It is therefore an object of the invention to provide an improved instruction retry mechanism using shadow register files.

It is another object of the invention to provide an improved instruction retry mechanism which is more efficient than those provided in the prior art.

It is still a further object of the invention to provide an improved instruction retry mechanism which enables the retry of short segments of recently executed code in one clock cycle.

It is still a further object of the invention to provide an instruction retry mechanism which is adaptable to provide programmable constants in any data flow.

SUMMARY OF THE INVENTION

The present invention is a shadow register file design providing the unique ability to load or "shadow" the contents of a primary array into a shadow array at the completion of a stored instruction execution. This is accomplished in one clock cycle with all registers being shadowed simultaneously. During rollback of the execution steps, the shadow register files provide a single cycle unload of the shadow array into the primary array. The load and unload functions are controlled by special control signals to the array. The control signal activates a write path from the primary array to the shadow array and back from the shadow to primary array.

The shadow register file consists of input register data buffers for driving data into the arrays, primary and shadow arrays for receiving data, output multiplexor and buffer decode logic to control read and write addressing and clock control logic. In a preferred embodiment, a configuration of 16 words by 18 bits per word having two write ports and two read ports, are shown. Level sensitive scan design (LSSD) latches are used in the shadow register file and operate on nonoverlapping clocks to write data into a master latch which then can be transferred into a slave latch. The input register of the shadow register file represents the master latch and the primary array acts as an array of slave latches. Which array addresses are written to is controlled by the write decode logic which clocks the gates of the slave clock. The shadow array exists as a special form of a master latch which gets written to by each storage cell of the primary array.

BRIEF DESCRIPTION OF THE DRAWINGS

These and other objects, features and advantages of the invention will be more fully appreciated with reference to the accompanying Figures.

DESCRIPTION OF THE PREFERRED EMBODIMENT

Figure 1:
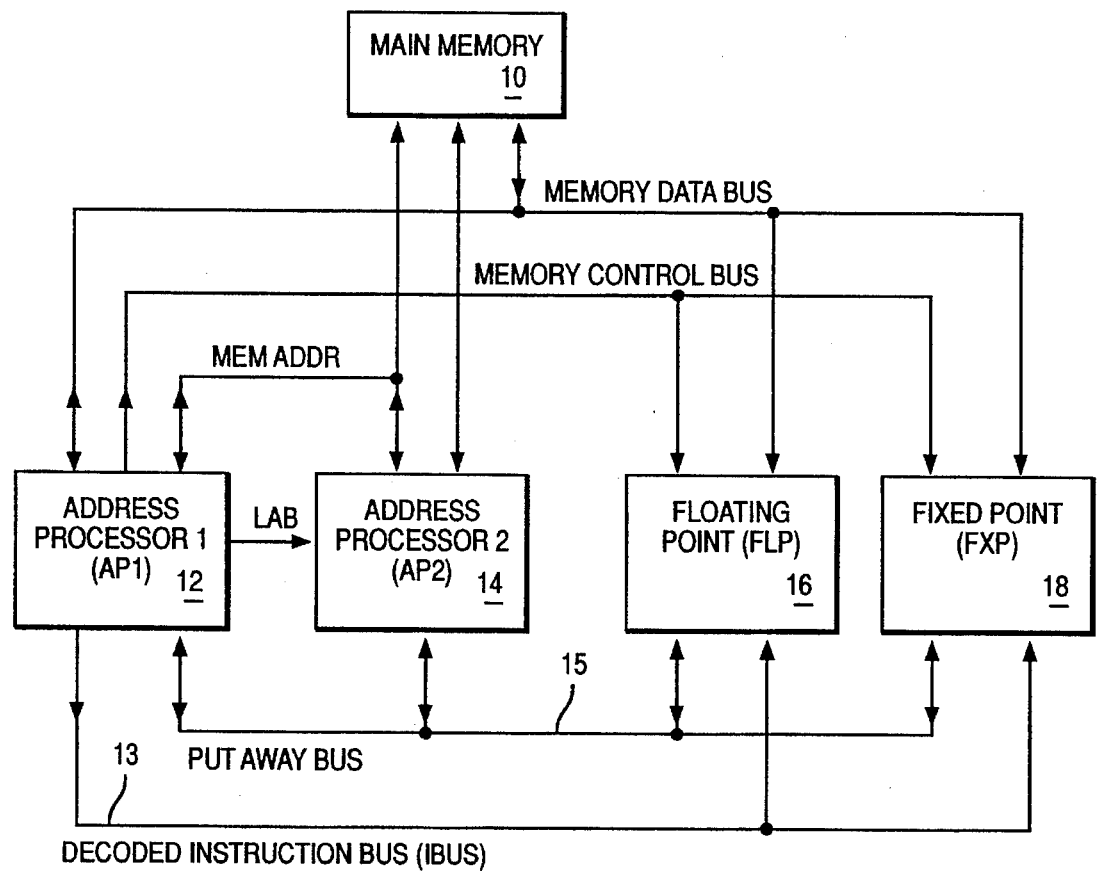
FIG. 1 is a functional block diagram of a fault-tolerant data processing system.

A typical fault-tolerant computer system is shown in FIG. 1. The address processor 12 reads instructions from the main memory 10 and dispatches commands to execution elements, such as fixed point processor 18 and floating point processor 16 or the address translator 14. The AP1 12 sources the instruction bus 13 (I-Bus) which issues service requests to the execution elements. Any general purpose partition updating is done across the putaway bus 15 shown.

Figure 2:
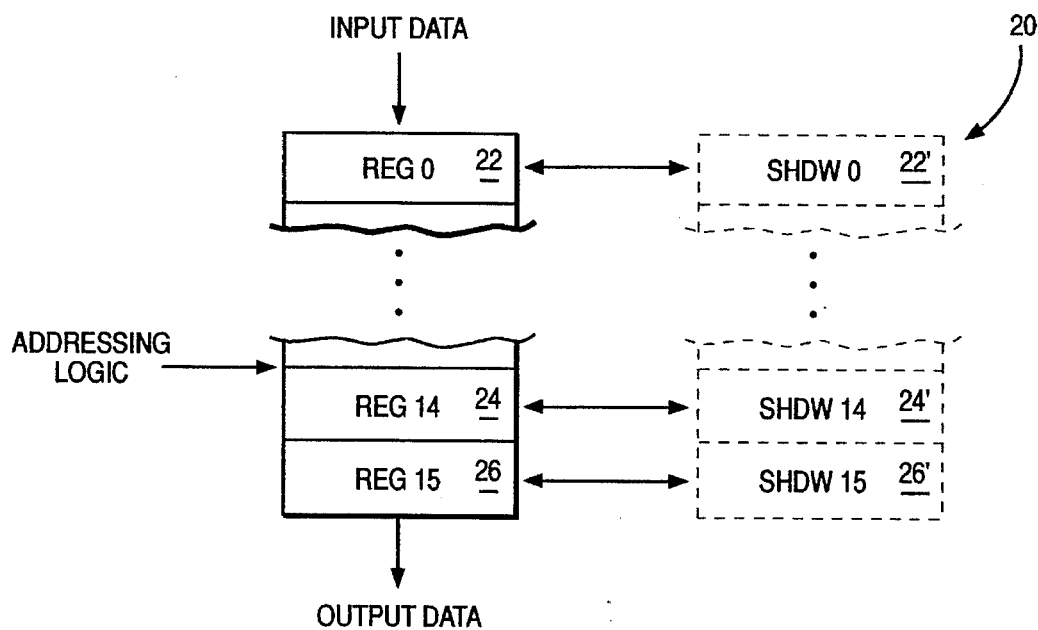
FIG. 2 illustrates the shadow register file configuration of the present invention.

The shadow register file is built to store checkpoint register values while serving the read and write functions of a normal register file. The feature which allows this is the shadow cell associated with each memory element of the array. This relationship between memory elements and their shadow cell is shown in FIG. 2. When a memory write is executed, the general purpose register (GPR) values are saved in the FXP's shadow register files. With saved data, the processor can be rolled back to its last known good state if an error is detected between memory writes. In the shadow register file 20, input data is received in register 22 along with its shadow register 22'. In the example shown, there are 16 general purpose registers ranging from zero to register 14 labeled 24 with its associated shadow register 24' and register 15 denoted by reference numeral 26 with its shadow register 26'. Input data is read into the top stack of the register and output through the bottom. Addressing logic uses pointers to denote which register to access for a read or write.

In a fault-tolerant data processing system, the checkpoint is established by saving the contents of the 16 GPRs, the program counter and the condition status field of the program status word into backup registers. A checkpoint is invoked by AP1 12 by using a checkpoint command on the putaway bus 15. While the primary function of the putaway bus is to transfer the general purpose register data between chips, it can be used to transmit commands during cycles when the AP1 determines that no GPR data will be transferred.

Figure 3:
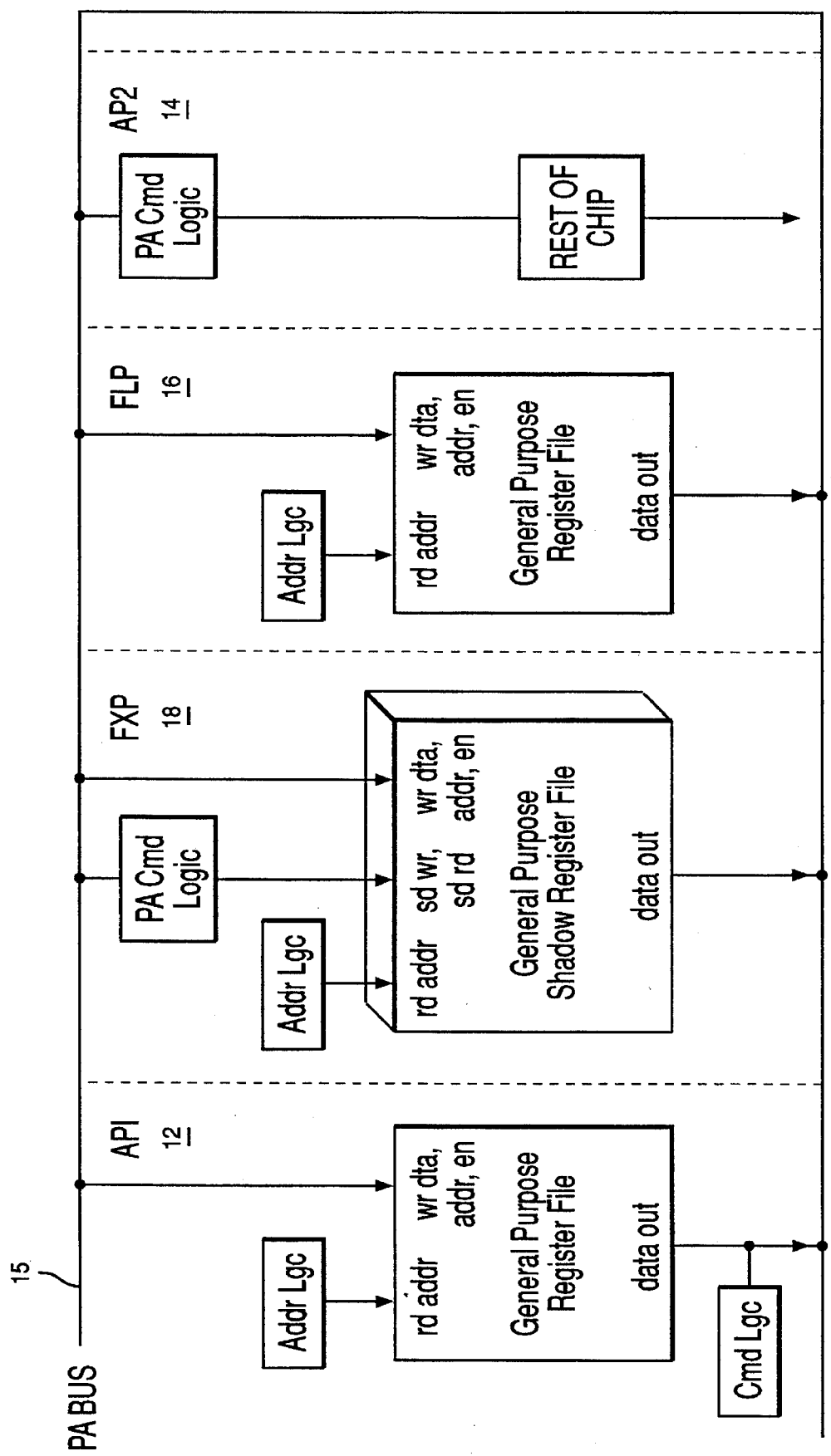
FIG. 3 is a schematic of the general purpose register management within the fault-tolerant data processing system.

FIG. 3 shows the distribution of GPR data and putaway commands across the putaway bus. When a checkpoint is invoked, AP2 14 loads the condition status field of the program status word into its backup register. The fixed point processor 18 loads the GPR's data into its shadow register and AP1 saves the program counter value. Since all 16 GPRs are in parallel, they can be loaded into the shadow register as part of a register file macro and a checkpoint can therefore be established in one clock cycle. A checkpoint is established at the completion of the store instruction, external I/O, load status and branch to executive commands.

Anytime an error occurs, fault-tolerant computer systems will attempt to retry their operation by rolling back to a previous checkpoint and reexecuting the previous stream of code. In the present invention a rollback is established by AP1 12 updating the program counter from its shadow register and issuing a command to FXP 18 to dump all the shadow GPR contents to the putaway bus 15. The FXP 18 receives the command from the AP1 across the I Bus 13 as a special instruction. The FXP microcode then reads each of the shadow GPR locations one at a time and transfers it contents to the putaway bus. AP1 12 also issues a command to AP2 14 to restore the condition status fields of the program status word, thus reestablishing the state of the processor at the checkpoint. Instruction execution then begins again from the checkpoint maintaining program integrity.

Figures 4, 6:
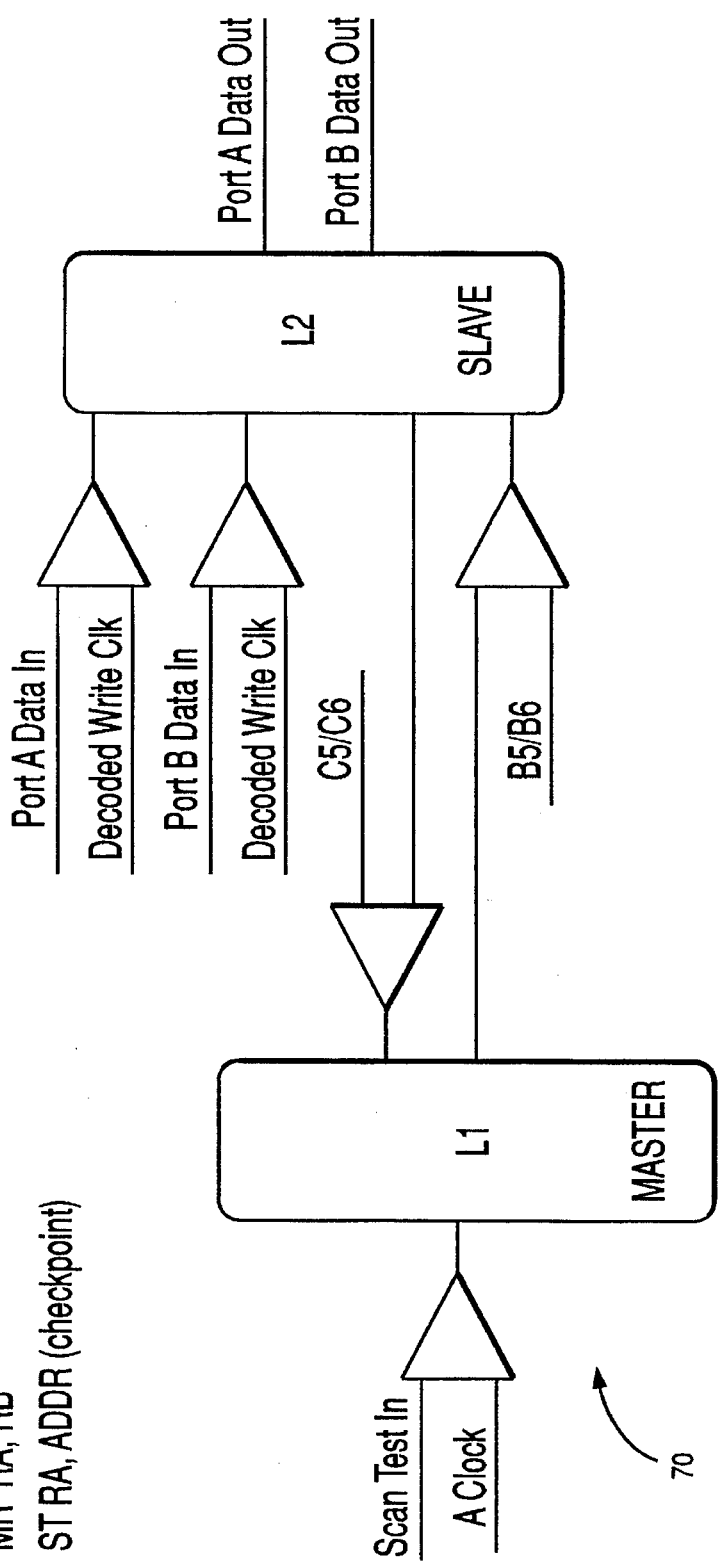
FIG. 4 is an example of instruction flow containing check points.
FIG. 6 is a logic diagram of the master and slave arrays.

The table of FIG. 4 shows a sample stored instruction flow. At the completion of the store instruction in instruction number three, the processor establishes a checkpoint by saving the state as previously described. If a parity error or one of many other errors were encountered in instruction five, the processor would rollback to instruction four and begin execution again. If no errors are encountered, the execution will continue smoothly with the next checkpoint taken after the execution of instruction eight.

If an error does not reoccur following a rollback, the checkpoint can be moved ahead and the instruction cycle continued with a new transfer of array content to the shadow registers and normal execution will continue. If the error does reoccur, the processing unit will generate an interrupt signal indicating that a solid error has been detected and an interrupt driven recovery procedure will select the appropriate action to manage the fault. In this scenario the checkpoint can be moved incrementally up through the instruction sequence to better pin point where in the sequence the processor is failing.

In order to achieve the desired shadowing effect, two memory storage devices must be used per bit of data. Using traditional master/slave latches would require a macrocell prohibitively large. Conversely, standard memory cells provide inadequate scan access to the cells for testing. Therefore, additional circuitry would be required with either approach to feed data back and forth between the primary storage devices and the shadow storage devices. It is desirable to perform the desired logic and test functions in as small of an area as possible.

The shadow register file design provides the unique ability to load or shadow the contents of a primary array into a shadow array at the completion of a stored instruction. This is accomplished in one clock cycle with all registers being shadowed simultaneously. During a rollback, the shadow register file also provides the single cycle unload of the shadow array to primary array. The load and unload functions are controlled by special control signals to the array. These control signals activate write paths from primary to shadow array, and back from shadow array to primary array.

Figure 5:
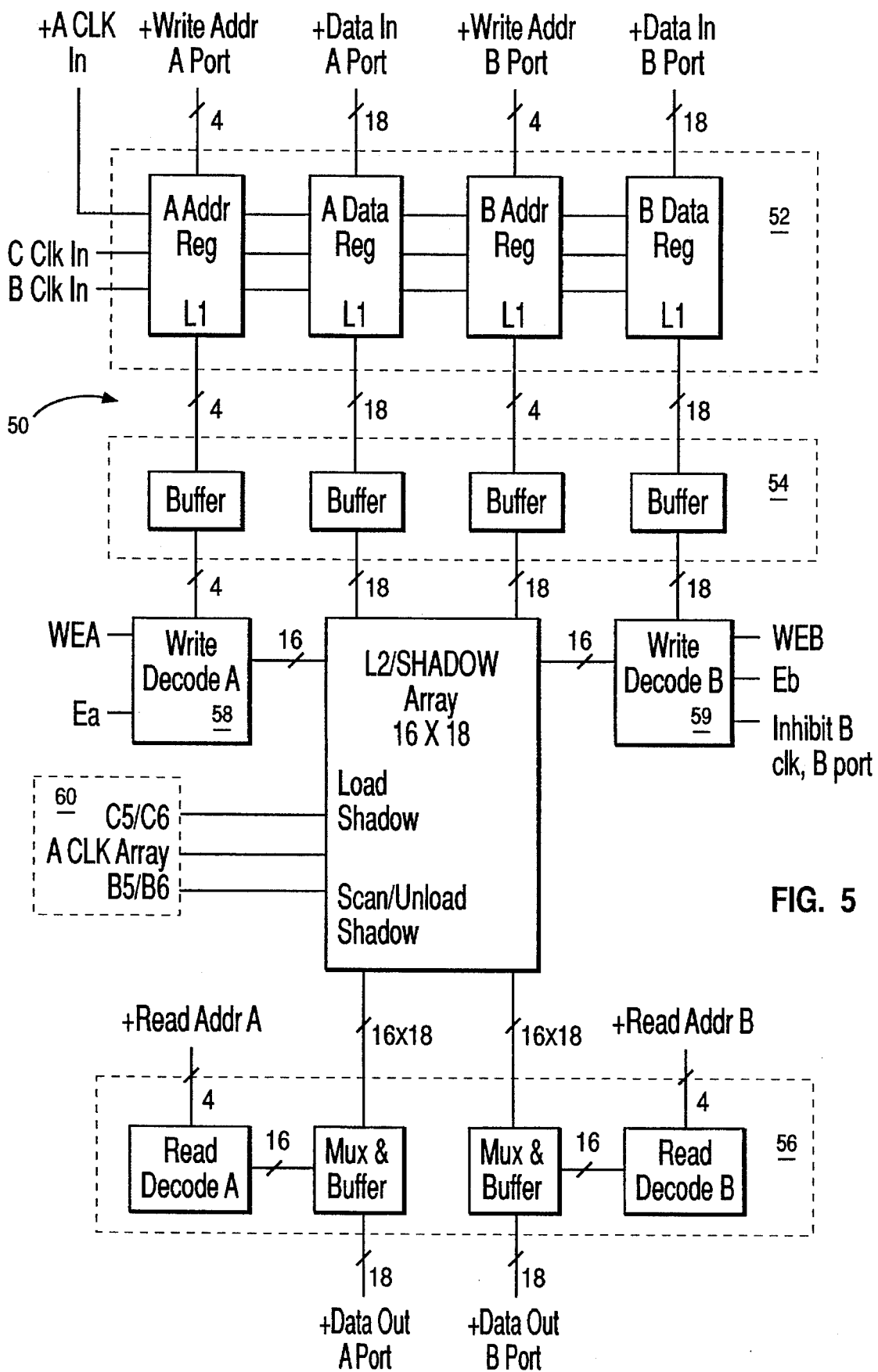
FIG. 5 is a logical representation of the shadow register of the present invention.

The block diagram of FIG. 5, shows the shadow register file (SRF). The SRF 50 consists of an input register 52, data buffers 54 driving into the array, primary and shadow arrays output multiplexor buffer 56, decode logic 58 and 59 which control the read and write addressing and clock control logic 60. This Figure shows a specific design configuration of 16 words by 18 bits per word with two write ports and two read ports. The design could however, consist of any reasonable number of read and write ports and any reasonable number of words and number of bits per words. The SRF uses level sensitive scan design (LSSD) latches which operate on nonoverlapping clocks to write data into a master latch and then transfer the data into a slave latch. The input register of the SRF represents the L1 of an LSSD latch, and the primary array acts as an array of L2 latches. Which array address are written to is controlled by the write decode logic which gates the L2 clock. The shadow array exists as a special form of an L1 latch which gets written to by each storage cell of the primary array.

The array storage cell 70 is shown in FIG. 6. It can be seen that data in the primary array L2 latch has a path to the L1 of the shadow latch provided when the C5/C6 clock is active. It is also the path for data to be written from the shadow array back into the primary array when the B5/B6 clock is active. Each storage cell in the array consists of this L1/L2 configuration. This L1/L2 configuration operates independently of the L1/L2 configuration of the L1 input register and the L2 primary array. The L1 input register and L2 primary array provide a normal or nonload/unload shadow, register file operation. The write into the L1 input register and write from L1 input into L2 array are controlled by standard L1/L2 clocks. The L1 clock is commonly designated as the "C" clock and the L2 clock is designated the "B" clock. In the register file the "B" clock enables the write decoder to provide a selective L2 write operation to only one word of the array.

With the C5/C6 clock all cells are commonly controlled, the entire shadow can be loaded with activation of the C5/C6 clock. In a similar manner, the entire array can be unloaded from the shadow register file by activation of the B5/B6 clock. This capability to load/unload the entire shadow register, particularly within one clock cycle, is advantageous to operation of a shadow register file for instruction rollback.

The LSSD latch design used as a storage/shadow is a unique design configuration because of its capability to transfer data between primary and shadow storage units. This bidirectional data transfer capability requires special attention to simultaneously address logic and test concerns while minimizing the area that the latch occupies. A special L1/L2 latch is utilized which provides multiple data write ports to the latch, since the primary storage element requires 2 data write-in ports as well as an unload shadow write port.

Another unique feature of the array cell is the reversal of roles between the master and slave during latch function. In order to address performance concerns, an attempt was made to balance the loading of the latch nodes and the L1/L2 of the array cell. Required paths into or through the array included a scan input for task and two data inputs to the primary array. The load shadow has a path into the shadow array from the primary array, the unload shadow has a path from the shadow array into primary array and transfer master has a path into the slave array. It was decided to load the latch designated L1 with the scan input port and load shadow, and load the latch designated L2 with the two data write ports and unload shadow/transfer L1 to L2. It should be noted that the unload shadow and transfer L1 to L2 for test became a single port with clock gating provided by the logic shown in FIG. 7. This is not a typical LSSD latch configuration, since there is no functional data written into the L1 of the latch. Only the test scan input and the load shadow ports write data into the L1 of the latch, and data written only into the L2 of the latch. However, this unique implementation provides balanced loading for performance with two ports of the L1 of the array latch and three ports on the L2 of the latch while maintaining full LSSD design rule compatibility, logic function and design compactness.

Figure 7:
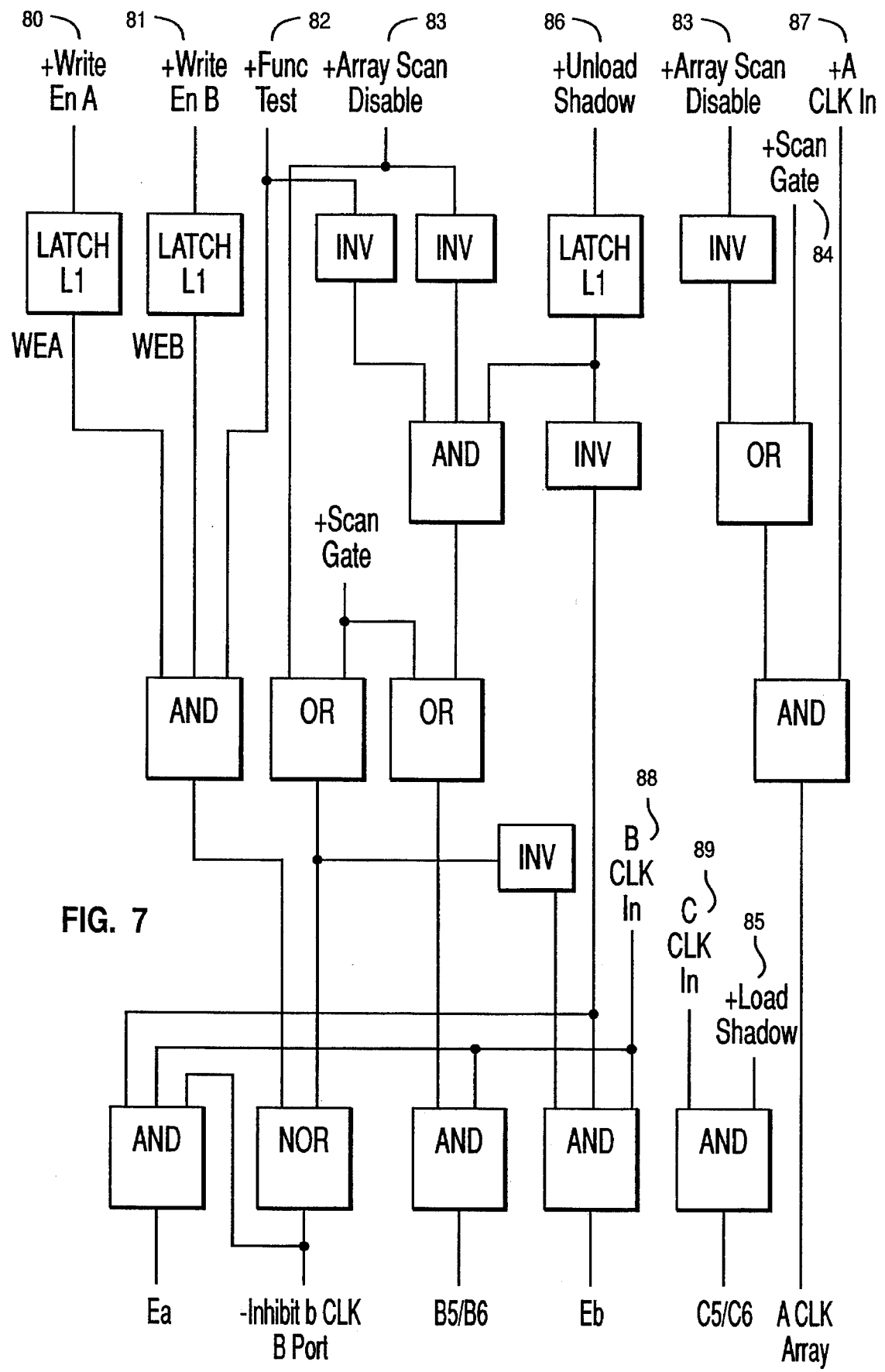
FIG. 7 shows an implementation of the logic arrays.

FIG. 7 shows a logical diagram of the generation of the clocks for the shadow array. Inputs to the clock's control logic include port A 80 and port B 81 write enables, test pins called functional test 82, array scan disable 83 and scan gate 84 the load 85 and unload 86 shadow controls and three clocks A 87, B 88 and C 89. The A clock and the LSSD scan clock which operates all latches are chained in a serial string as if they were a shift register. This is done along with the clock B using the B5/B6 clock pin. This scan or shift capability is the heart of the LSSD test methodology. Special gating is provided to the A and B clocks of the array for testing purposes. The scan gate array scan disable and functional test pins control this gating. As can be seen in FIG. 7, the gating of the load and unload shadow controls along with the B and C clocks are used to produce the B5/B6 and C5/C6 signals that are used within the array. This logic controls load and unload shadow functions while suppressing normal array writes while the unload shadow is active. Unload shadow suppresses writes to the array during the unload shadow cycle by deactivating the Ea and Eb signals which disable the write decoders which are shown in FIG. 5. This is necessary to prevent writing a word over data unloaded from the shadow. It is to be noted that in the load shadow, the loading of an L1 on a C clock needs no gating since no writing is occurring on L1, or the C clock half of the L1/L2 cycle, and there is no risk writing over any load data.

While the initial application of the shadow register file is for storing a snapshot of a register file for fault-tolerant applications, the range of possibilities for use of this shadowed latch is much more broad. The storage of a programmed state as defined by key register values is a ordinary part of interrupt servicing. The program state is often altered by the interrupt routines whether they are implemented in software or hardware and this must be restored for correct instruction execution upon completion of the interrupt. The array's potential applications are not limited to register files. The same basic arrayed cell design can be used in traditional registers. Beyond a register file of scratch pad registers, registers are commonly used in the program state of a specific processor including the program construction counter, the condition code register and others.

Figure 8:
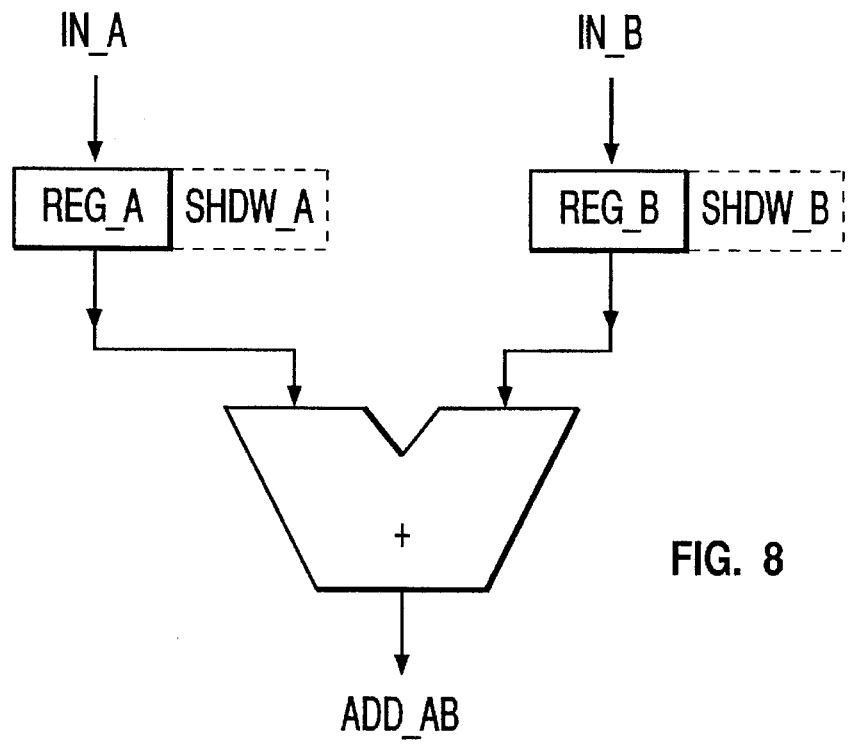
FIG. 8 shows a data flow utilizing shadow cells.

The shadow register file can be used to store available constants in any data flow. FIG. 8 shows a typical piece of data flow that of two registers feeding an address. Programmers often need to set one of these addresses to a constant during execution of a series or loop of instructions. The constant may be plus one, minus one, or zero or any other number for a specific program. Rather than manipulating an input operand each time a constant is needed, which is a potential performance degradation, a programmer can simply use the shadowed value of register A or B.

Figure 9:
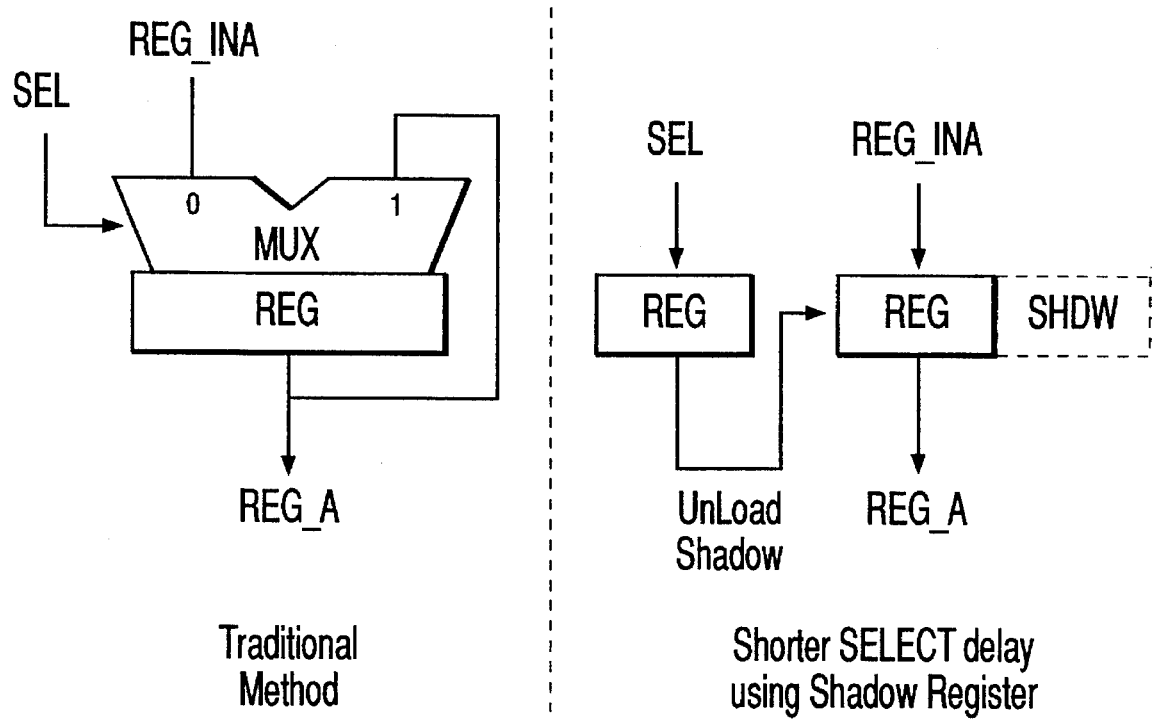
FIG. 9 illustrates a speed enhancement feature using the present invention.

The shadow cell could be used as a timing/performance enhancement in some applications. Often clock speeds are limited by the delays necessary to determine whether a register should be updated. The selected signal must be either gated off the clock or more typically selected as appropriate from a multiplexor. FIG. 9 shows that the value can be postponed a cycle by latching in the new value without waiting for the select signal and latching the select signal. At the beginning of the next cycle, the select signal would be used to either unload the foregone register or the shadow. This would reduce the select path delay by the multiplexor delay.

Therefore, the shadow register file for instruction rollback includes checkpoint and retry, interrupt service, programmable constants or improving register select delays. The design integrates the necessary circuitry required to create data paths between a primary and shadow storage device. The dense chip design in which this can be implemented provides cost advantages. The shadow register file allows a fast method for storing a portion of the program state without overly complicated amount of hardware control. At a designated time, the register's files content are preserved in the shadow cells. If at a later time the diagnostic logic of the processor detects an error, the processor can be stopped, reset back to point of the error or the data transferred from the shadow cells back to the memory cells as opposed to the beginning of the instruction sequence and the instructions can be retried again. The need for fault-tolerant features such as instruction rollback rise as new applications for higher reliability systems increases. Among these applications are banking system, medical systems, certain real-time defense systems. In these applications a quick error recovery scheme is essential. The use of a shadow register file rollback, described above, can help meet the demand for higher reliability.

What is claimed is:

1. In a data processing system having an instruction memory containing a sequence of executable instructions and an arithmetic logic unit which operates in response to said instructions for carrying out arithmetic and logic operations, apparatus comprising:

a plurality of general purpose register files comprising a plurality of L2 latches of level sensitive scan design ("LSSD") latches for storing information;

corresponding shadow register files comprising a plurality of L1 latches of said LSSD latches coupled to said general purpose register files for storing the contents of said L2 latches within one clock cycle; and said shadow register files having respective outputs coupled to corresponding inputs of said general purpose register files for transferring the contents of said L1 latches to said L2 latches within one clock cycle in response to a specific event in the arithmetic logic unit.

2. The apparatus of claim 1 wherein said event comprises an error being detected in the arithmetic logic unit by a checkpoint retry mechanism.

3. The apparatus of claim 2 wherein instruction rollback is automatically enabled in response to said error being detected by said checkpoint retry mechanism.

4. The apparatus of claim 1 wherein said LSSD latches operate in response to nonoverlapping clocks.

5. The apparatus of claim 1 wherein said information comprises a plurality of instructions stored in respective ones of said general purpose register files.

6. The apparatus of claim 1 wherein said information comprises a plurality of addresses stored in respective ones of said general purpose register files.

7. The apparatus of claim 6 wherein said information comprises a plurality of operand addresses stored in respective ones of said general purpose register files.

* * * * *